United States Patent
Park et al.

(10) Patent No.: US 7,138,331 B2
(45) Date of Patent: Nov. 21, 2006

(54) METHOD FOR MANUFACTURING NANO-GAP ELECTRODE DEVICE

(75) Inventors: Chan Woo Park, Daejeon-shi (KR); Sung Yool Choi, Daejeon-shi (KR); Sang Ouk Ryu, Daejeon-shi (KR); Han Young Yu, Daejeon-shi (KR); Ung Hwan Pi, Daejeon-shi (KR); Tae Hyoung Zyung, Daejeon-shi (KR)

(73) Assignee: Electronics and Telecommunications Research Institute, Daejon-Shi (KR)

(*) Notice: Subject to any disclaimer, the term of this patent is extended or adjusted under 35 U.S.C. 154(b) by 0 days.

(21) Appl. No.: 10/800,704

(22) Filed: Mar. 16, 2004

(65) Prior Publication Data

US 2005/0112860 A1    May 26, 2005

(30) Foreign Application Priority Data

Nov. 20, 2003  (KR) .................... 10-2003-0082418

(51) Int. Cl.
*H01L 21/4763* (2006.01)
(52) U.S. Cl. .................................... 438/622
(58) Field of Classification Search ............... 438/597, 438/622; 257/E29.01; 977/780, 781, 784, 977/932

See application file for complete search history.

(56) References Cited

U.S. PATENT DOCUMENTS

| 5,751,156 A | 5/1998 | Muller et al. | |
|---|---|---|---|
| 5,981,866 A * | 11/1999 | Edelson | 136/256 |
| 6,103,615 A * | 8/2000 | Sugasawara et al. | 438/622 |
| 6,291,328 B1 * | 9/2001 | Nobori et al. | 438/561 |
| 6,447,663 B1 | 9/2002 | Lee et al. | |
| 6,781,160 B1 * | 8/2004 | Tsai et al. | 257/98 |
| 2001/0168810 | 11/2002 | Jackson | |
| 2002/0168810 A1 * | 11/2002 | Jackson | 438/172 |

FOREIGN PATENT DOCUMENTS

| JP | 06-053206 | 2/1994 |
|---|---|---|
| KR | 1020030052665 | 6/2003 |

OTHER PUBLICATIONS

M.A. Reed, et al.; "Conductance of a Molecular Junction"; Science; vol. 278; Oct. 10, 1997; pp. 252-254.

Hongkun Park, et al.; "Fabrication of metallic electrodes with nanometer separation by electromigration"; Applied Physics Letters; vol. 75, No. 2; Jul. 12, 1999, pp. 301-303.; Jul. 1998.

Michael Austin, et al.; "Fabrication of nanocontacts for molecular devices using nanoimprint lithography"; J. Vac. Sci. Technol. B; vol. 20, No. 2; Mar./Apr. 2002; pp. 665-667.

(Continued)

*Primary Examiner*—Michelle Estrada
(74) *Attorney, Agent, or Firm*—Mayer, Brown, Rowe & Maw LLP (57) ABSTRACT

Provided is a method for manufacturing a nano-gap electrode device comprising the steps of: forming a first electrode on a substrate; forming a spacer on a sidewall of the first electrode; forming a second electrode on an exposed substrate at a side of the spacer; and forming a nano-gap between the first electrode and the second electrode by removing the spacer, whereby it is possible to control the nano-gap position, width, shape, and etc., reproducibly, and manufacture a plurality of nano-gap electrode devices at the same time.

4 Claims, 11 Drawing Sheets

OTHER PUBLICATIONS

A.F. Morpurgo, et al.; *"Controlled fabrication of metallic electrodes wiht atomic separation"*; Applied Physics Letters; vol. 74, No. 14; Apr. 5, 1999; pp. 2084-2086.

Y.V. Kervennic, et al.; *"Nanometer-spaced electrodes with calibrated separation"*; Applied Physics Letters; vol. 80, No. 2; Jan. 14, 2002; pp. 321-323.

* cited by examiner

METHOD FOR MANUFACTURING NANO-GAP ELECTRODE DEVICE

BACKGROUND

1. Field of the Invention

The present invention relates to a nano-gap electrode device having a nano-gap with a width of several nanometers or less between two electrodes and, more particularly, to a method for manufacturing a nano-gap electrode device that the nano-gap position and width can be adjusted readily and a plurality of nano-gaps can be fabricated.

2. Discussion of Related Art

As information and communication technology have been developed, a quantity of transferable information increases geometrically. As a result, integrity for processing the large quantity of information in a semiconductor device has been enhanced continuously. In a prior art, the integrity of the semiconductor device has been improved by a top-down method that a size and a line width of the device are reduced through an enhancement of a resolving power in a photolithography process. However, it is not applicable for a practical use since the process thereof is difficult and it is required a high cost. Thus, a nano molecular device has been developed so as to solve the aforementioned problems and improve an economical efficiency. Recently, a nano molecular device fabricated by a bottom-up technology has been proposed.

The molecular device is such a device that applies electronic transport through molecules each having a length of several nm or less, contrary to a silicon based semiconductor device of a prior art. The molecular device has been considered as a next generation technology since a high-integrated high-speed circuit can be implanted with low costs. The molecular device requires external electrodes connected to both sides of the molecule for an electrical characteristic evaluation. For this, it is necessary to implant electrode devices that are spaced apart from each other across a nano-gap corresponding to a molecular length of several nm or less.

Conventionally, the nano-gap electrode device has been manufactured by a method that a certain portion of a metal line is broken by mechanical stress or electromigration, or a method that a gap having a width of hundreds of nm is formed first by electron beam lithography, and then an electrode material is further deposited on surfaces of the two electrodes by means of an electrochemical deposition method to thereby narrow the width of the gap. However, the methods as mentioned above have demerits that the processes thereof are complex and the precise control of the gap position and width is difficult. As a result, reproducibility and reliability get deteriorated. In addition, it is not applicable for the fabrication of integrated molecular device circuits since a plurality of nano-gap devices each having the same shape and width cannot be implanted at the same time.

FIGS. 1A to 1E are typical views for explaining a method for manufacturing a nano-gap electrode device according to a prior art, in which a metal line is broken by mechanical stress. And, FIGS. 1B to 1E are enlarged views of A portion shown in FIG. 1A.

Figure 1A:
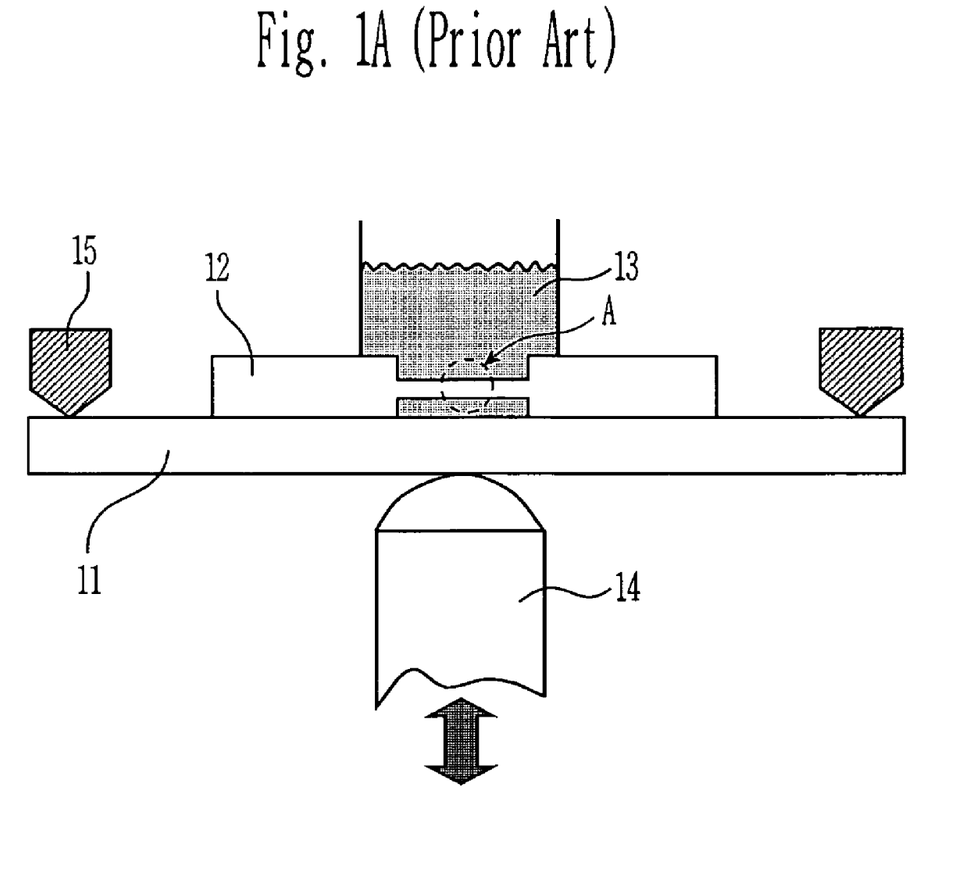
FIGS. 1A to 1E are typical views for explaining a method for manufacturing a nano-gap electrode device according to a prior art, in which a metal line is broken by mechanical stress.

Referring to FIG. 1A, a metal line 12 is formed with a gold (Au) and etc. on a substrate 11 that is covered with an insulation film and composed of a silicon and so on, and then a central portion of the metal line 12 is dipped in a solution 13 including a certain molecular material. A configuration 14 is contacted with a bottom side of the substrate 11, where corresponds to the central portion of the metal line 12, and mechanical configurations 15 are contacted with an upper side of the substrate 11, at both sides of the metal line 12.

Figure 1B:
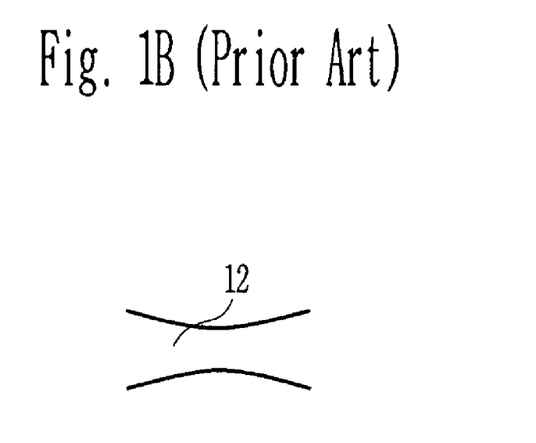
Figure 1C:
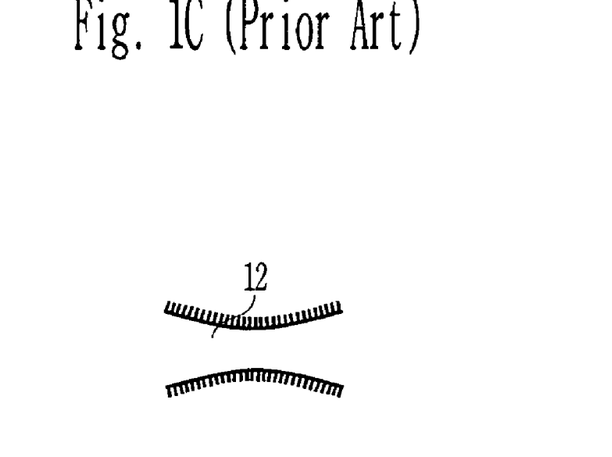

Referring to FIGS. 1B and 1C, if a mechanical stress is applied to the substrate 11 in an upper direction by raising the configuration 14 while the mechanical configurations 15 being fixed, the central portion of the substrate 11 comes to be bent upward by the applied stress.

Figure 1D:
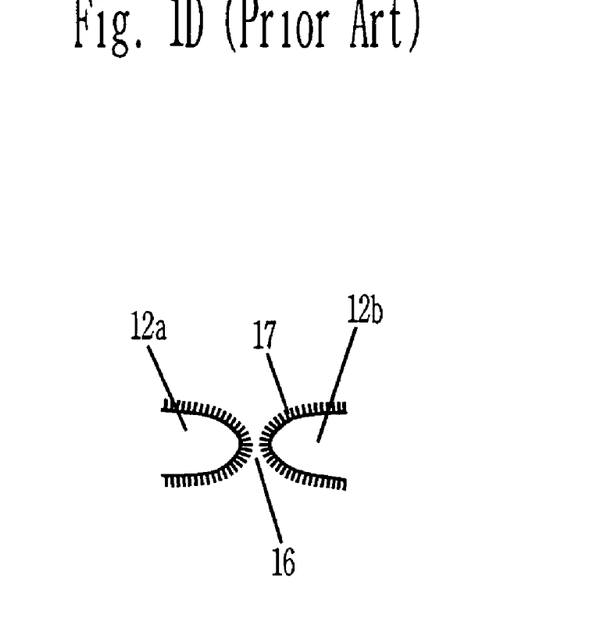

Referring to FIG. 1D, a certain portion of the metal line 12 is broken, resulting in a gap 16 if bending of the substrate 11 becomes larger with an increase of the stress. A self-assembled monolayer (SAM) 17 is formed on surfaces of two facing metallic electrodes 12a and 12b across the gap 16.

Figure 1E:
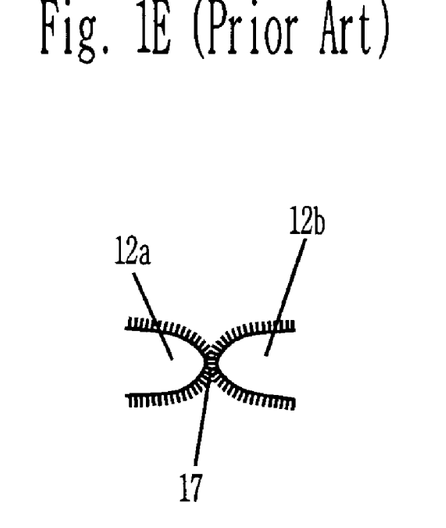

Referring to FIG. 1E, the bent substrate 11 is flattened, so that the two metallic electrodes 12a and 12b come to be contacted each other again across the monolayer 17, if the lower configuration 14 goes down and is returned to an original position.

Therefore, an electric signal may be applied to the monolayer 17 through the two metallic electrodes 12a and 12b.

As described above, the method for manufacturing the nano-gap electrode device of the conventional art, in which the metal line is broken by the mechanical stress, has demerits that the process thereof is complex and the precise control over the gap position and shape is difficult, so that reproducibility and reliability get deteriorated and a plurality of nano-gap electrode devices cannot be fabricated at the same time. In addition, it is difficult to apply to a fabrication of an integrated molecular device circuit, since the mechanical stress applied to a certain position affects the other regions of the periphery.

Figure 2A:
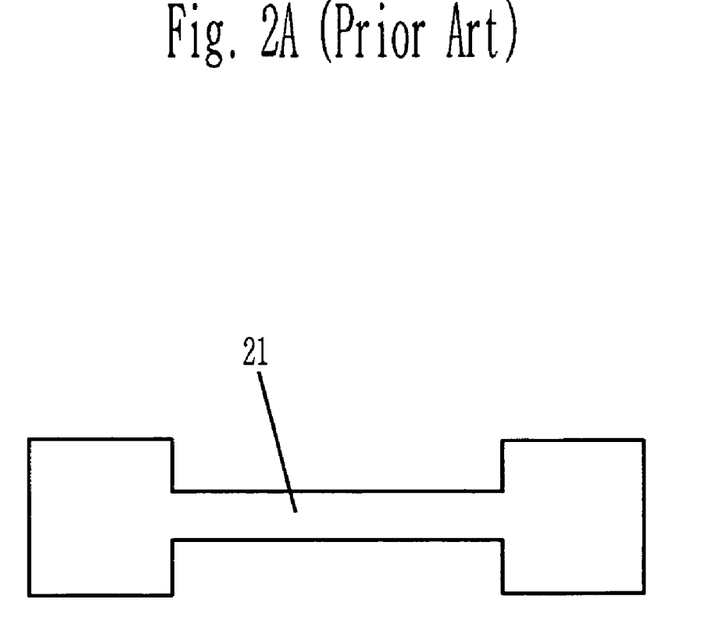
FIGS. 2A to 2C are typical views for explaining a method for manufacturing a nano-gap electrode device according to a prior art, in which a metal line is broken by electromigration.
Figure 2B:
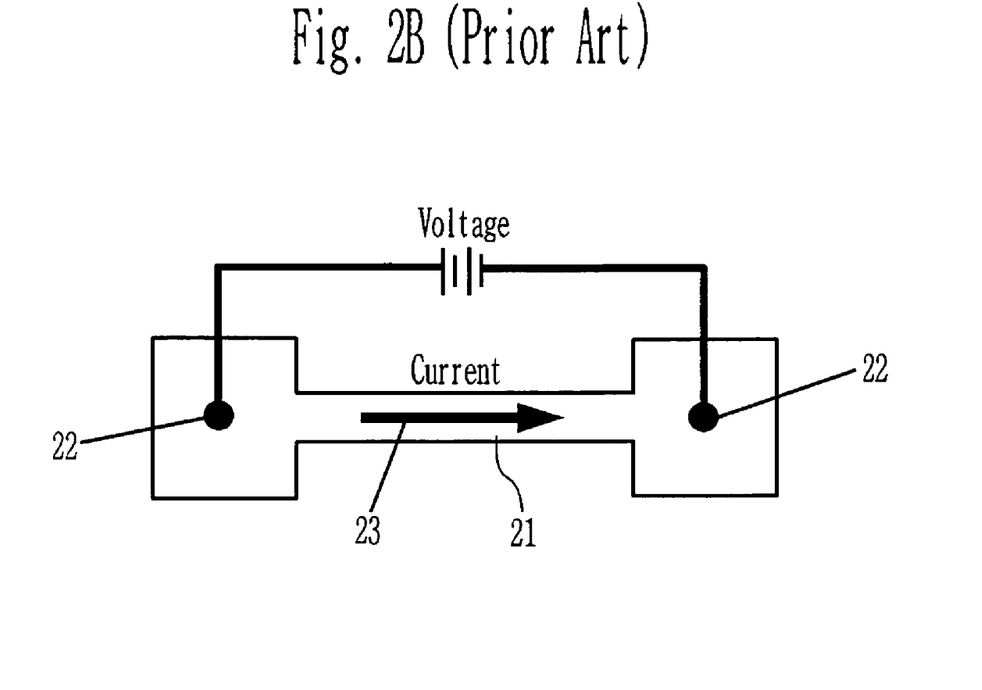
Figure 2C:
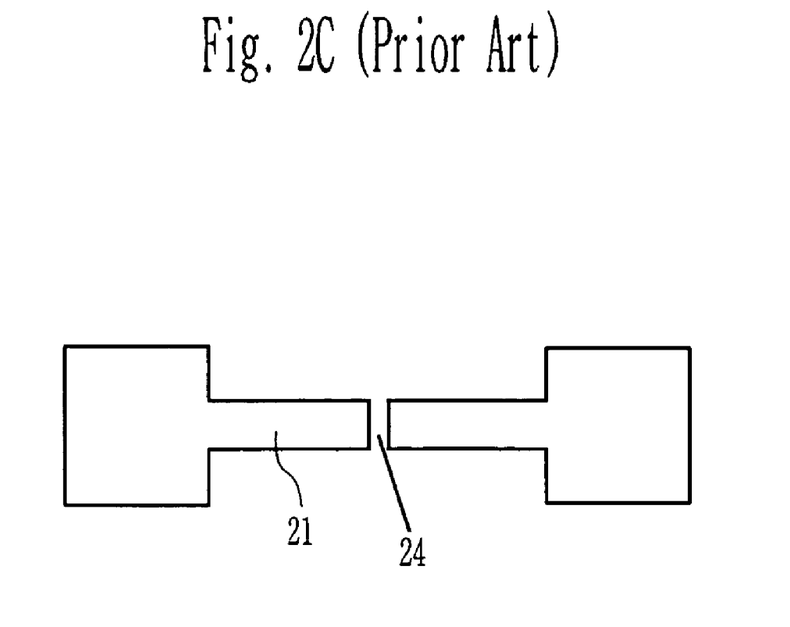

FIGS. 2A to 2C are typical views for explaining a method for manufacturing a nano-gap electrode device according to a prior art, in which the metal line is broken by electromigration.

Referring to FIG. 2A, a metal line 21 with a line width of several tens of nm to hundreds of nm is formed by using a conventional semiconductor process technology.

Referring to FIG. 2B, large quantity of currents 23 pass through the metal line 21 by applying a voltage through terminals 22 at both sides of the metal line 21.

Referring to FIG. 2C, atoms inside the metal line 21 come to move gradually due to an effect of electron flow when the currents pass through, as mentioned above. The aforementioned phenomenon is referred to as an electromigration, by which a certain portion of the metal line 21 is broken, resulting in a nano-gap 24 having a width of several nm. The method for manufacturing the nano-gap electrode device of the prior art, in which the metal line is broken by electromigration, has a merit that the process thereof is simple relatively. However, it has demerits that the precise control over the gap position, width, and shape is difficult, thereby reproducibility being deteriorated, and a plurality of nano-gap electrode devices cannot be fabricated at the same time.

Figure 3A:
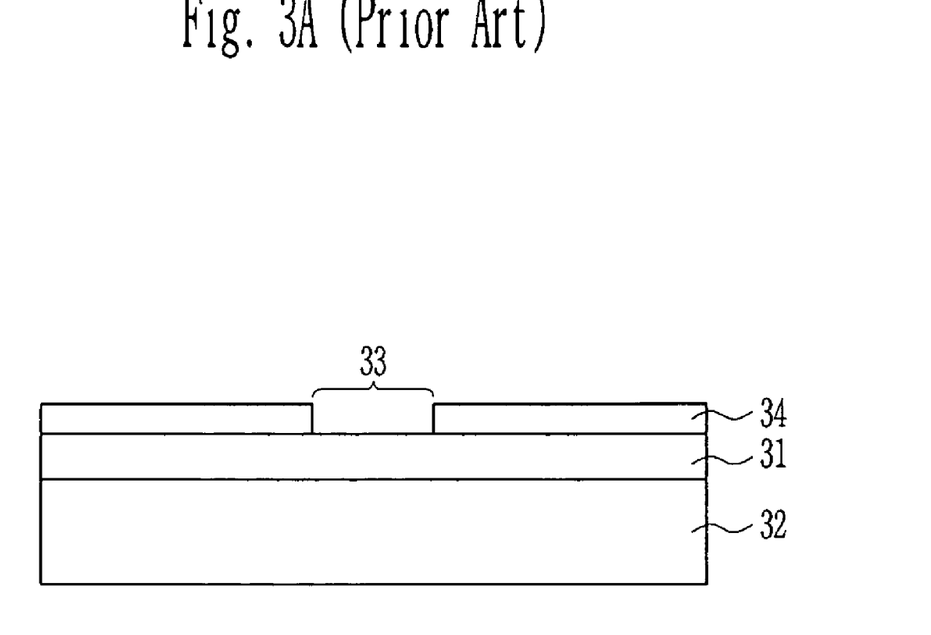
FIGS. 3A and 3B are cross sectional views for explaining a method for manufacturing a nano-gap electrode device using an electrochemical deposition method, according to a prior art.
Figure 3B:
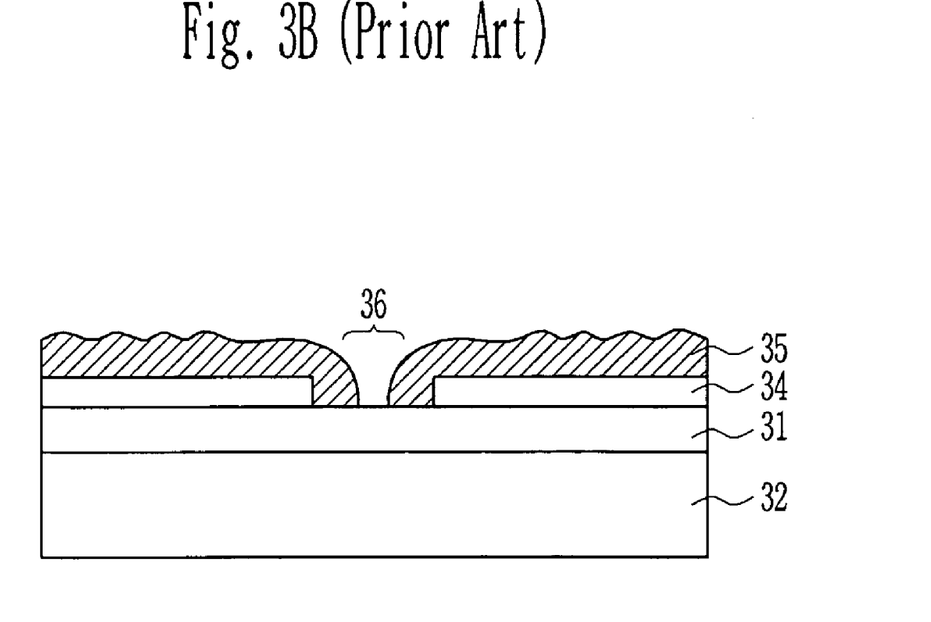

FIGS. 3A and 3B are cross sectional views for explaining a method for manufacturing a nano-gap electrode device using electrochemical deposition method, according to a prior art;

Referring to FIG. 3A, two metallic electrode patterns 34 are formed on a semiconductor substrate 32 on which an insulation film 31 is formed, wherein the two metallic electrode patterns are spaced apart from each other across a predetermined gap 33. The metallic electrode patterns 34 may be formed by using a conventional semiconductor process technology such as electron beam lithography, and a width of the gap 33 may be about hundreds of nm.

Referring to FIG. 3B, an electric terminal (not shown) is connected to the metallic electrode pattern 34, and the whole substrate 32 including the metallic electrode patterns 34 are dipped in a certain electrolyte solution. Electrode layers 35 are deposited on surfaces of the metallic electrode patterns 34 if a voltage is applied to the metallic electrode patterns 34 through the electric terminal. The width of the gap becomes thin more and more as the thickness of the deposited electrode layers 35 become thicker. As a result, a nano-gap 36 is fabricated.

However, the method for manufacturing the electrode device using the electrochemical deposition in accordance with the prior art has demerits that the process thereof is complex, the precise control over the width of the nano-gap is difficult, and a plurality of the nano-gap electrode devices cannot be fabricated at the same time.

SUMMARY OF THE INVENTION

The present invention is directed to a method for manufacturing a nano-gap electrode device capable of exactly controlling the gap position and width and fabricating a plurality of nano-gap devices at the same time.

One aspect of the present invention is to provide a method for manufacturing a method for manufacturing a nano-gap electrode device, comprising the steps of: forming a first electrode on a substrate; forming a spacer on a sidewall of the first electrode; forming a second electrode on an exposed substrate at a side of the spacer; and forming a nano-gap between the first electrode and the second electrode by removing the spacer.

Here, the substrate is a glass, an oxide, a high polymer, a silicon, a compound semiconductor, a metal, or a combination thereof. The spacer is formed with the same thickness as a width of the nano-gap, and preferably, with a thickness of 1 nm to thousands of nm. And, the spacer is formed with a material having high etching selectivity to the substrate and the first electrode.

In a preferred embodiment of the present invention, the step of forming the spacer on the sidewall of the first electrode, comprising the steps of: depositing a separation layer with a predetermined thickness on the substrate including the first electrode; and etching the separation layers on the top surfaces of the substrate and the first electrode while leaving the spacer on a sidewall of the first electrode, said spacer being composed of the separation layer. Here, the separation layer is deposited with the same thickness on a surface and a sidewall of the first electrode, and the substrate, and is etched by means of an anisotropic dry etching method. In addition, the electrode material is not deposited on the sidewall of the spacer at the time of a deposition process for forming the second electrode. The deposition process is performed by means of electron beam evaporation method. And, the second electrode is formed with a thickness thinner than that of the first electrode.

Another aspect of the present invention is to provide a method for manufacturing a nano-gap electrode device, comprising the steps of: forming a first electrode on a substrate; forming a separation layer with a predetermined thickness all over the substrate including the first electrode; removing a portion or all of the separation layer on the top surface of the first electrode; forming a second electrode on the separation layer, which is formed on the substrate at a side of the first electrode; and forming a nano-gap between the first electrode and the second electrode, by removing the separation layer remained therebetween.

Here, the separation layer is formed with the same thickness as a width of the nano-gap, and deposited with the same thickness on a surface and a sidewall of the first electrode, and the substrate. In addition, the separation layer is formed with a material having high etching selectivity to the substrate and the first electrode.

Meanwhile, the second electrode is formed with a thickness thinner than that of the first electrode. The electrode material is not deposited on the sidewall of the separation layer at the time of a deposition process for forming the second electrode.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in the drawing, the thickness and size of each layer are exaggerated for convenience of explanation and clarity. Like reference numerals are used to identify the same or similar parts. Further, in case where it is described that one film is "on" the other film or a semiconductor substrate, the one film may directly contact the other film or the semiconductor substrate. A third film may be intervened between the one film and the other film or the semiconductor substrate.

Figure 4A:
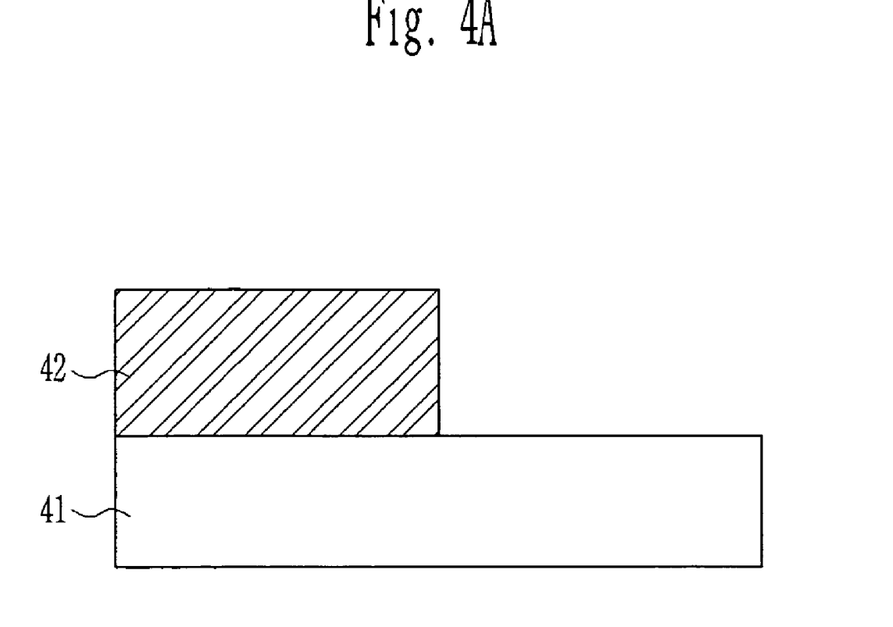
FIG. 4A to 4E are cross sectional views for explaining a method for manufacturing a nano-gap electrode device, according to a preferred embodiment of the present invention.
Figure 4B:
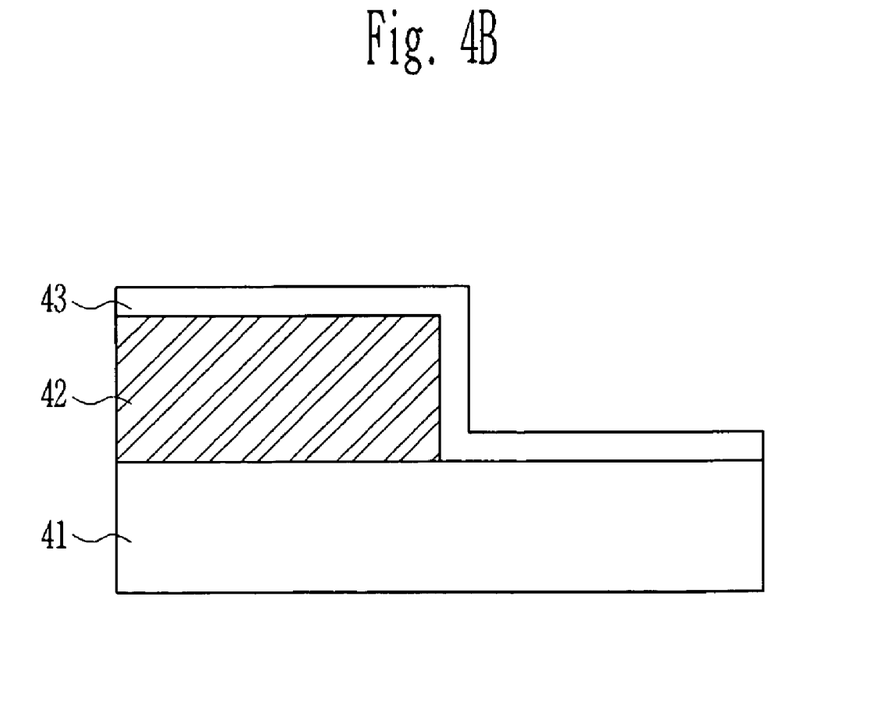
Figure 4C:
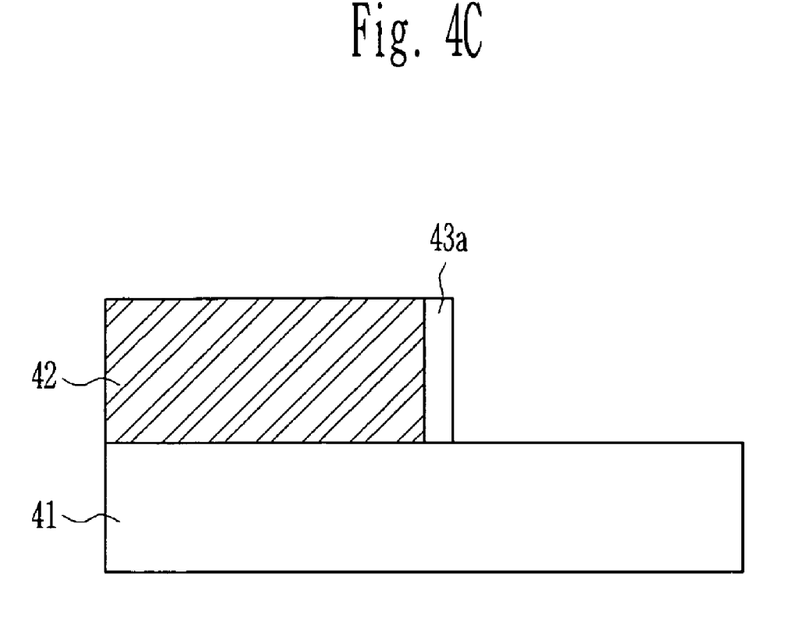
Figure 4D:
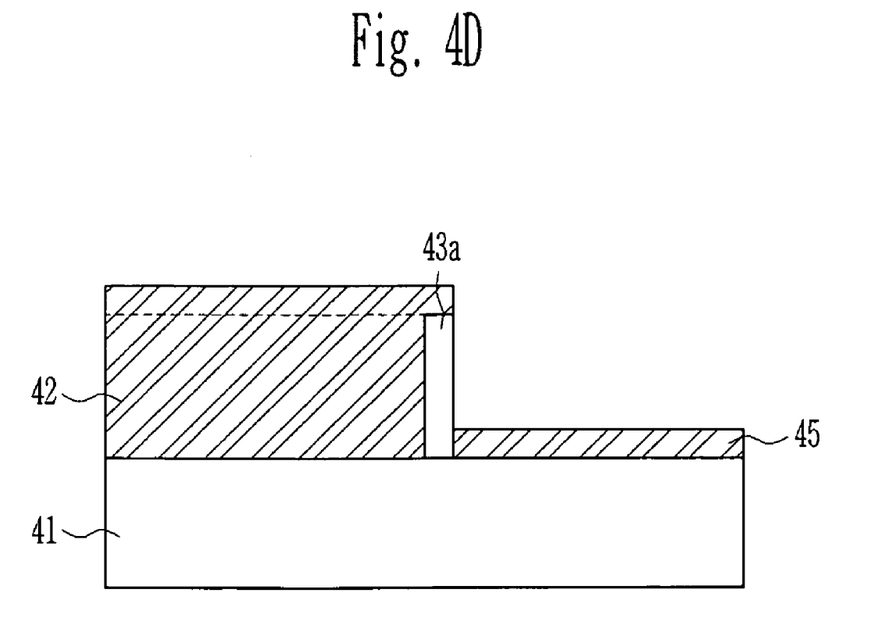
Figure 4E:
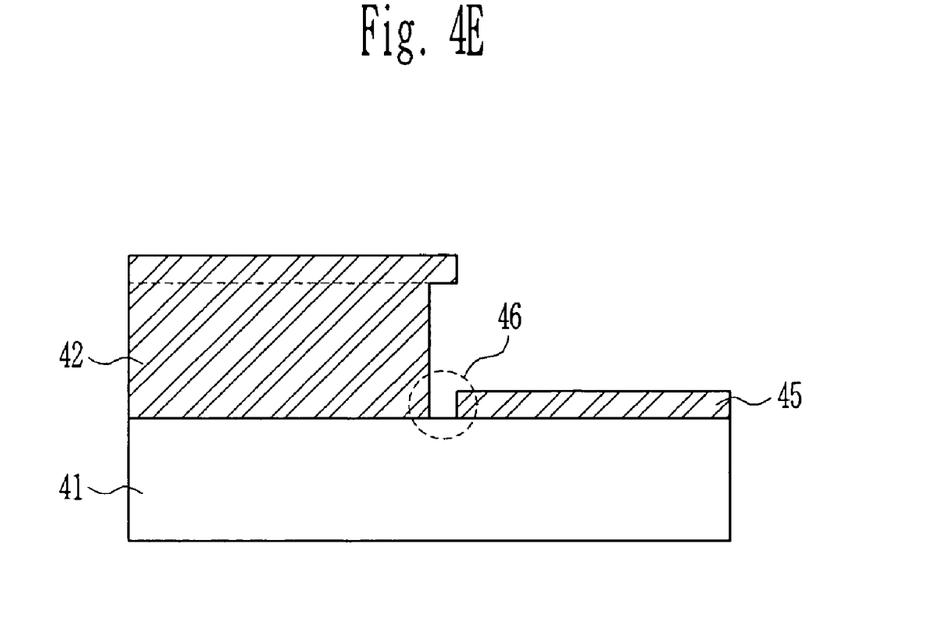
Figure 5:
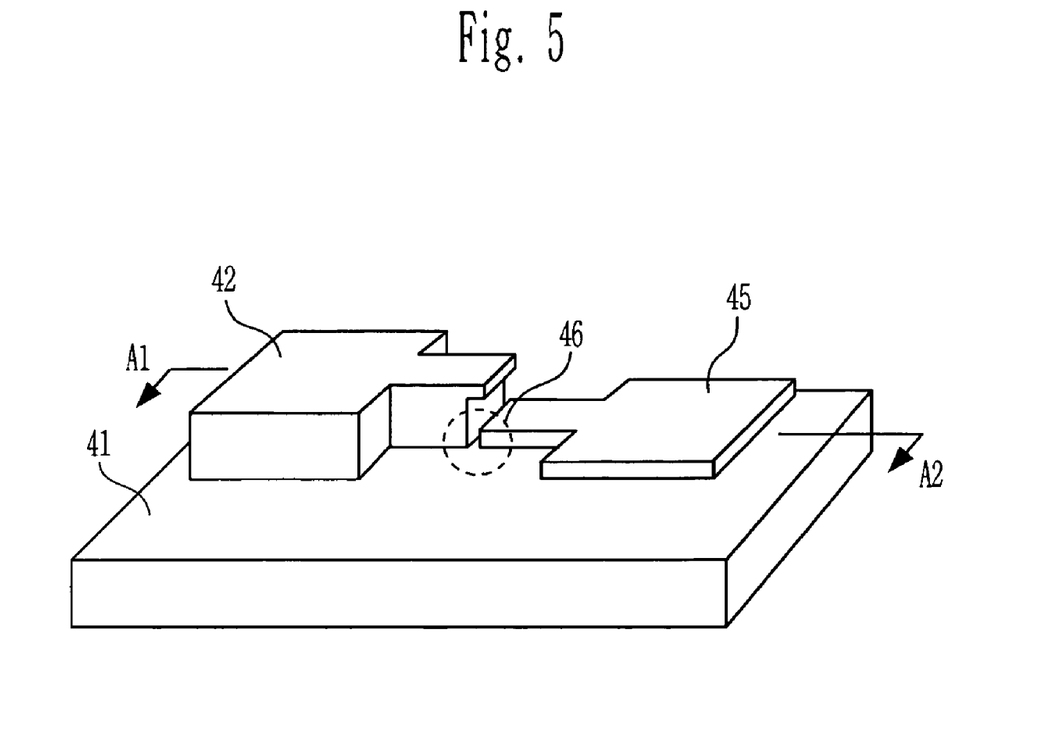
FIG. 5 is a whole structure of a nano-gap electrode device according to the present invention.

FIGS. 4A to 4E are cross sectional views for explaining a method for manufacturing a nano-gap electrode device according to a preferred embodiment of the present invention, and FIG. 5 is a whole structure of a nano-gap electrode device according to the present invention.

Referring to FIG. 4A, a first electrode 42 is formed by depositing an electrode material on a substrate 41 for supporting a device and pattering it. The substrate 41 may be a glass, an oxide, a high polymer, a silicon, a compound semiconductor, a metal, or a combination thereof.

Referring to FIG. 4B, a separation layer 43 is formed with a predetermined thickness all over the substrate 41 including the first electrode 42. The separation layer 43 may be composed of a material having a high etching selectivity to the substrate 41 and the first electrode 42, and deposited with a uniform thickness on the top surface and sidewall of the first electrode 42, by using a deposition method having excellent step coverage. At this time, the thickness of the separation layer 43 may be adjusted the same as a desired width of the nano-gap.

Referring to FIG. 4C, the separation layers on the top surfaces of substrate 41 and the first electrode 42 are removed and, at the same time, a spacer 43a composed of the separation layer 43 remains on the sidewall of the first electrode 42, by performing an anisotropic dry etching process without an extra etch mask.

Referring to FIG. 4D, an electrode material is deposited all over the substrate 41 to form a second electrode 45 on an exposed substrate 41 at the side of the spacer 43a. The electrode material is deposited with a thickness thinner than that of the first electrode 42, by means of a deposition method having low step coverage such as e-beam evaporation, so that the second electrode 45 is formed on the exposed substrate 41 leaving a sidewall of the spacer 43a. At this time, the thickness of the first electrode 42 becomes thick by the thickness of the deposited electrode material, since the electrode material is deposited on the first electrode 42 and the spacer 43a.

In addition, the second electrode 45 may be formed by another method of depositing an electrode material all over the substrate and patterning it, thereby leaving it on the exposed substrate 41 only.

Referring to FIG. 4E, a nano-gap 46 is formed by a thickness of the spacer 43a between the first electrode 42 and the second electrode 45, by etching the spacer 43a. FIG. 4E shows a cross section taken along A1–A2 line in FIG. 5. Preferably, a width of the nano-gap 46 is in the range of 1 to thousand of nanometers (nm), according to the present invention.

FIGS. 6A to 6E are cross sectional views for explaining a method for manufacturing a nano-gap electrode device according to another embodiment of the present invention.

Figure 6A:
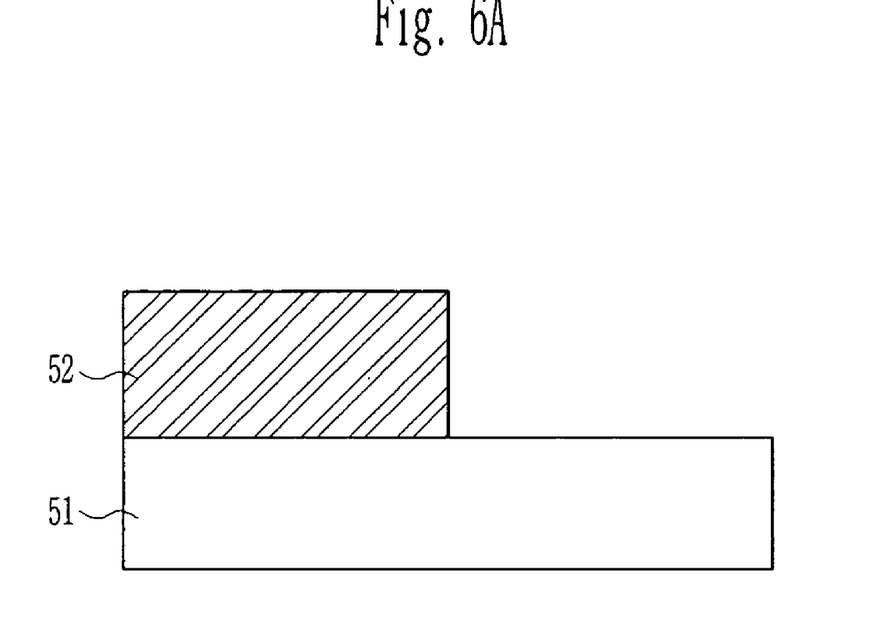
FIGS. 6A to 6E are cross sectional views for explaining a method for manufacturing a nano-gap electrode device, according to another preferred embodiment of the present invention.

Referring to FIG. 6A, a first electrode 52 is formed by depositing an electrode material on a substrate 51 for supporting a device and patterning it. The substrate 51 may be a glass, an oxide, a high polymer, a silicon, a compound semiconductor, a metal, or a combination thereof.

Figure 6B:
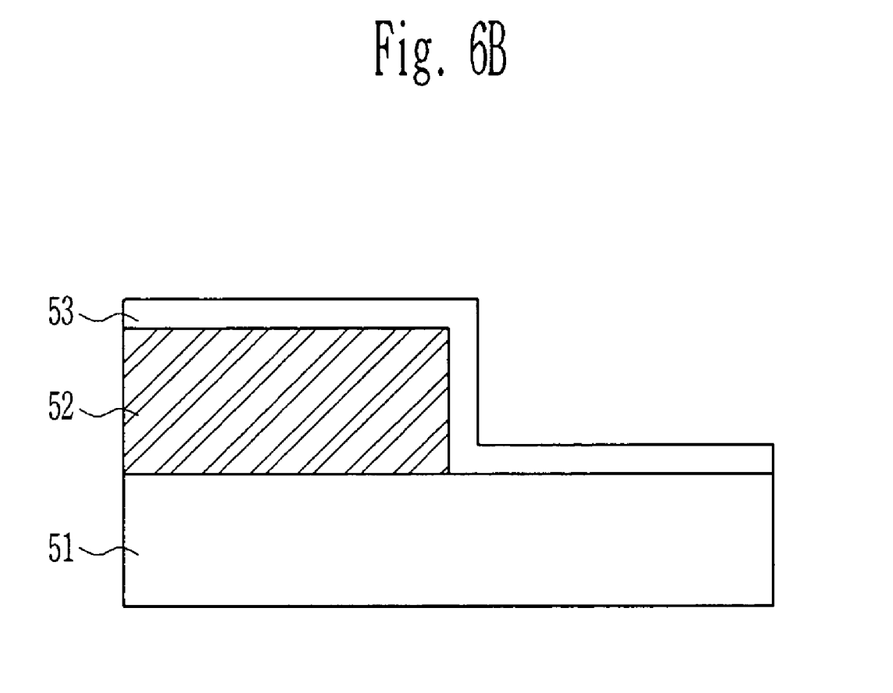

Referring to FIG. 6B, a separation layer 53 is formed with a predetermined thickness all over the substrate including the first electrode 52. The separation layer 53 may be composed of a material having a high etching selectivity to the substrate 51 and the electrode material 52, and deposited with a uniform thickness on the top surface and sidewall of the first electrode 52, by using a deposition method having excellent step coverage. At this time, the thickness of the separation layer 53 may be adjusted the same as a desired width of nano-gap.

Figure 6C:
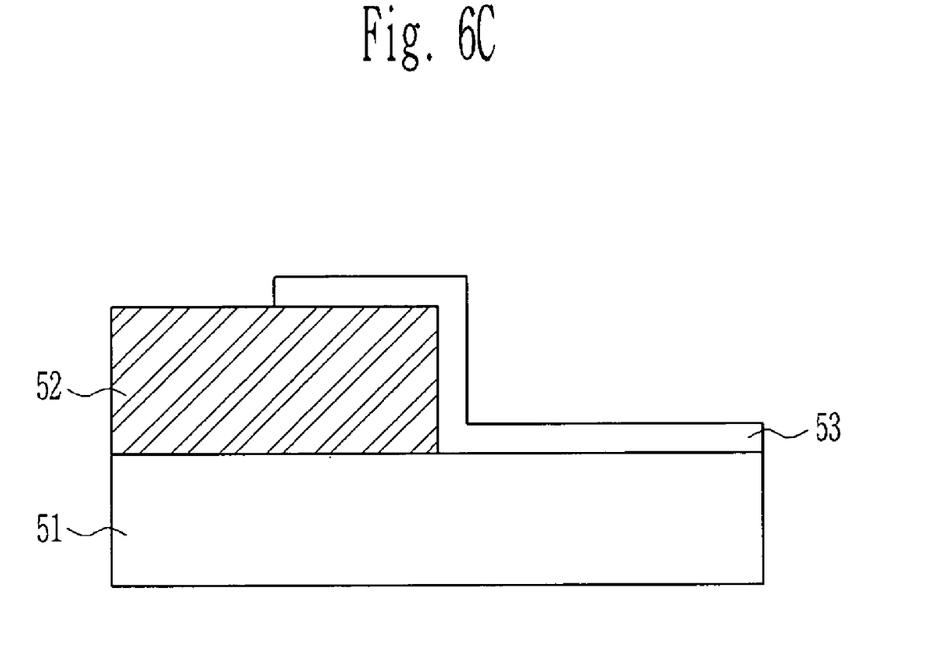

Referring to FIG. 6C, a portion or all of the separation layer 53 on the top surface of the first electrode 52 is removed by means of an etching process using a predetermined mask and, at the same time, the separation layer 53 on the sidewall of the first electrode 52 and on the substrate 51 remain.

Figure 6D:
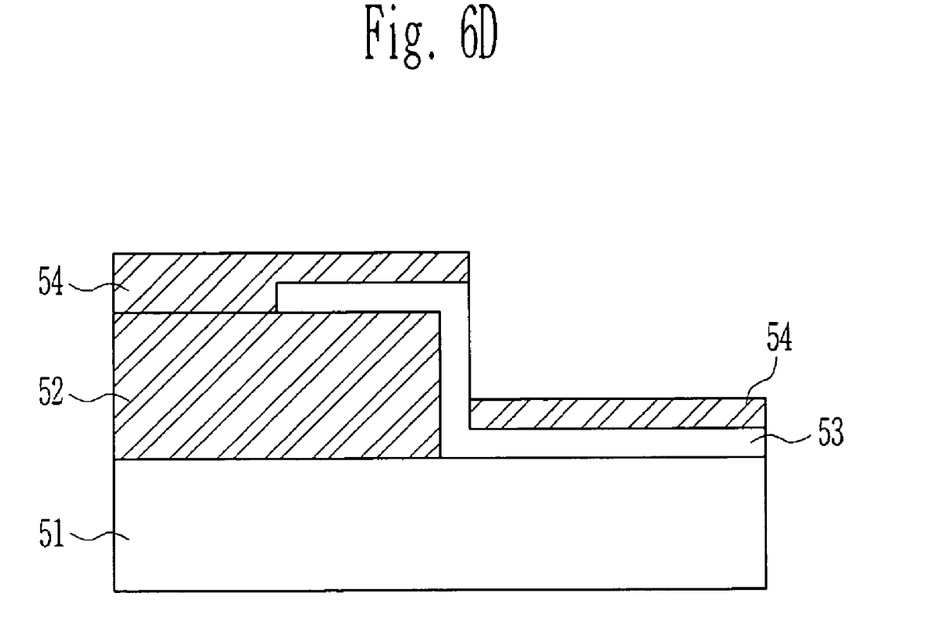

Referring to FIG. 6D, an electrode material is deposited on the separation layer 53, which is formed on the substrate 51 at the side of the first electrode 52, so as to form a second electrode 54. The electrode material is deposited with a thickness thinner than that of the first electrode 52, and the second electrode 54 is only formed on the separation layer 53 at the side of the first electrode 52 leaving a surface of the separation layer 53 on the sidewall of the first electrode 52, by means of a deposition method having low step coverage such as e-beam evaporation. At this time, the thickness of the first electrode 52 becomes thicker by the thickness of the deposited electrode material, since the electrode material is deposited on the first electrode 52.

In addition, the second electrode 54 may be formed by another method of depositing an electrode material all over the substrate and patterning it, thereby forming the second electrode 54 on the separation layer 53 that is formed on the substrate 51 at the side of the first electrode 52.

Figure 6E:
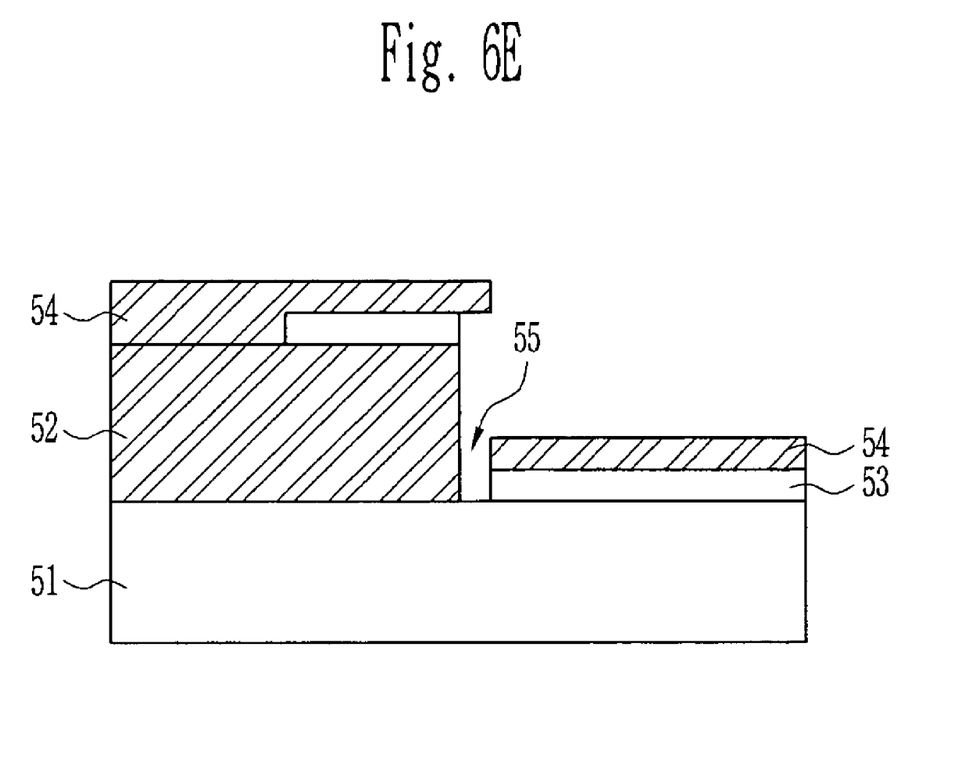

Referring to FIG. 6E, a nano-gap 55 is formed by a thickness of the separation layer 53 between the first electrode 52 and the second electrode 54, by etching the separation layer 53 remained therebetween. Preferably, a width of the nano-gap 55 is in the range of 1 to thousand of nanometers (nm), according to the present invention.

In the method for manufacturing the nano-gap electrode device according to the prior arts, there has been a problem that the nano-gap position, width, shape, and etc. may be changed even in the case of performing the processes in the same manner, so that reproducibility and reliability of the process get deteriorated. Further, it is impossible to realize an integrated molecular device circuit comprising a plurality of molecules, since only one nano-gap could be fabricated at a time. However, it is possible to exactly control over the nano-gap position, width, shape, and etc., and manufacture the nano-gap device reproducibly having the same structure as well, in the case of employing a method for manufacturing a nano-gap electrode device according to the preferred embodiments of the present invention. In addition, the present invention is applicable to a fabrication of an integrated molecular device circuit since a plurality of nano-gap electrode devices can be manufactured at the same time.

As described above, a nano-gap of the present invention may be fabricated by forming a spacer with a material having high etching selectivity to an electrode between two electrodes, and removing it. Thus, it is possible to control the nano-gap position, width, shape, and etc., reproducibly, and manufacture a plurality of nano-gap electrode devices at the same time, according to a method for manufacturing a nano-gap electrode device, contrary to a conventional method of breaking the metal line by mechanical stress or electromigration, or of narrowing the gap that was formed largely first, by means of electron beam evaporation method. Therefore, a molecular device circuit can be implanted with reliability.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for manufacturing a nano-gap electrode device, comprising:

forming a first electrode on a substrate;

forming a separation layer with a predetermined thickness all over the substrate including the first electrode;

removing a portion or all of the separation layer on the first electrode;

forming a second electrode on the separation layer, which is formed on the substrate at a side of the first electrode; and forming a nano-gap between the first electrode and the second electrode, by completely removing the separation layer remained therebetween;

wherein the separation layer is formed with the same thickness as a width of the nano-gap, and deposited with the same thickness on a surface and a sidewall of the first electrode, and the substrate.

2. The method as claimed in claim 1, wherein the separation layer is formed with a material having high etching selectivity to the substrate and the first electrode.

3. The method as claimed in claim 1, wherein the second electrode is formed with a thickness thinner than that of the first electrode.

4. The method as claimed in claim 1, wherein the electrode material is not deposited on the sidewall of the separation layer at the time of a deposition process for forming the second electrode.

* * * * *